(12) United States Patent
Bhardwaj et al.

(10) Patent No.: US 7,772,804 B2
(45) Date of Patent: Aug. 10, 2010

(54) METHOD AND APPARATUS FOR DETERMINING THE HEALTH OF AN ENERGY STORAGE SYSTEM

(75) Inventors: Ramesh Bhardwaj, Fairview, CA (US); Ajith Kuttannair Kumar, Erie, PA (US)

(73) Assignee: General Electric Company, Schenectady, NY (US)

( * ) Notice: Subject to any disclaimer, the term of this patent is extended or adjusted under 35 U.S.C. 154(b) by 490 days.

(21) Appl. No.: 11/834,456

(22) Filed: Aug. 6, 2007

(65) Prior Publication Data

US 2009/0038500 A1    Feb. 12, 2009

(51) Int. Cl.
*H01M 10/44*    (2006.01)
*H01M 10/46*    (2006.01)

(52) U.S. Cl. .................................................. 320/132
(58) Field of Classification Search ................ 320/103, 320/107, 112, 116, 132, 149; 324/426, 427, 324/430, 433
See application file for complete search history.

(56) References Cited

U.S. PATENT DOCUMENTS

| | | |
|---|---|---|
| 2006/0232240 A1 | 10/2006 | Salasoo et al. |
| 2006/0284601 A1 | 12/2006 | Salasoo et al. |
| 2008/0024137 A1* | 1/2008 | Carlin et al. ............... 324/427 |

* cited by examiner

*Primary Examiner*—Edward Tso
(74) *Attorney, Agent, or Firm*—John A. Kramer, Esq.; Armstrong Teasdale LLP

(57) ABSTRACT

A method for testing the health of locomotive battery blocks includes coupling a load to a first and a second battery block, the first and second battery blocks are coupled in series, activating a contactor coupled between the first and second battery blocks and the load to channel electrical energy from the load to the first and second battery blocks, and determining a voltage of the first and second battery blocks to determine the health of the locomotive battery blocks. A portable battery block health tester and a locomotive including a battery block health tester are also described herein.

18 Claims, 7 Drawing Sheets

METHOD AND APPARATUS FOR DETERMINING THE HEALTH OF AN ENERGY STORAGE SYSTEM

BACKGROUND OF THE INVENTION

This invention relates generally to an energy storage system, and more particularly to a method and apparatus for determining the health of a battery block that may be utilized in a locomotive.

Railroad locomotives typically include a diesel engine that is coupled to a traction drive system that provides the propulsion force for the locomotive. To start the diesel engine, locomotives include an energy storage system that is utilized to start the diesel engine and to provide electrical power to various devices installed on the locomotive. During operation, an alternator driven by the diesel engine, continuously recharges the energy storage system to ensure that the energy storage system remains charged to a predetermined voltage level.

To facilitate maintaining the operational readiness of the locomotive, the energy storage system is monitored to evaluate the effectiveness of the charging system and to ensure that the energy storage system is maintaining a proper charge. More specifically, at least one known locomotive implements the energy storage system utilizing a plurality of battery blocks. To monitor the health of the battery blocks, the battery blocks are periodically tested by measuring the specific gravity in each battery using a hydrometer, for example. However, utilizing the hydrometer to determine whether the battery is "good" or "bad" is not always effective. For example, data illustrates that at least some battery blocks have been removed from locomotives after failing the hydrometer test. Under more strenuous testing conducted at an off-site facility, it was determined that a smaller percentage of the battery blocks removed were defective. However, a larger percentage of the battery blocks removed were shown to be acceptable or "good" battery blocks. As a result, significant time and costs have been expended by the railroads removing, transporting, and testing battery blocks that were eventually determined to be operating correctly. In general there are two batteries in a locomotive containing 16-cells each. Each 16-cell battery is referred to as one monoblock. There are a total of 32 of cells in a set of locomotive batteries. The open circuit voltage of a fully charged cell is approximately 2.1 Volts. Two batteries connected in series provide approximately 67 Volts for the complete battery. It is common practice in rail road industry to check and service these batteries every 90-days. The practice has been to check the specific gravity of acid using a device called hydrometer. The test is time consuming as specific gravity of acid in each cell is measured. Opening the cap, drawing acid from the cell, and recording the specific gravity takes 3-4 minutes costing about 90-120 minutes every ninety days. Moreover, the hydrometer provides in-correct readings due to varying state-of-charge (SOC) of batteries as locomotive arrives in shops with different level of battery energy.

BRIEF DESCRIPTION OF THE INVENTION

In one aspect, a method for testing the health of locomotive battery blocks includes coupling a load to a first and a second battery block, the first and second battery blocks are coupled in series, activating a switch coupled between the pair of locomotive battery blocks and the load to channel electrical energy from the load to the pair of battery blocks, and determining a voltage of the first and second battery blocks to determine the health of the locomotive battery blocks.

In another aspect, a battery health tester is provided. The battery health tester includes a portable skid, a load mounted on the portable skid, and a switch coupled between a pair of battery blocks and the load, the switch utilized to channel electrical energy from the load to the pair of battery blocks to facilitate grid testing the pair of battery blocks.

In a further aspect a locomotive is provided. The locomotive includes a first battery, a second battery coupled in series with the first battery, a resistive grid coupled to the first and second battery blocks, and a battery health tester configured to utilize the resistive grid to determine the health of the battery.

DETAILED DESCRIPTION OF THE INVENTION

Many specific details of certain embodiments of the invention are set forth in the following description in order to provide a thorough understanding of such embodiments. One skilled in the art, however, will understand that the present invention may have additional embodiments, or that the present invention may be practiced without several of the details described in the following description.

Figure 1:
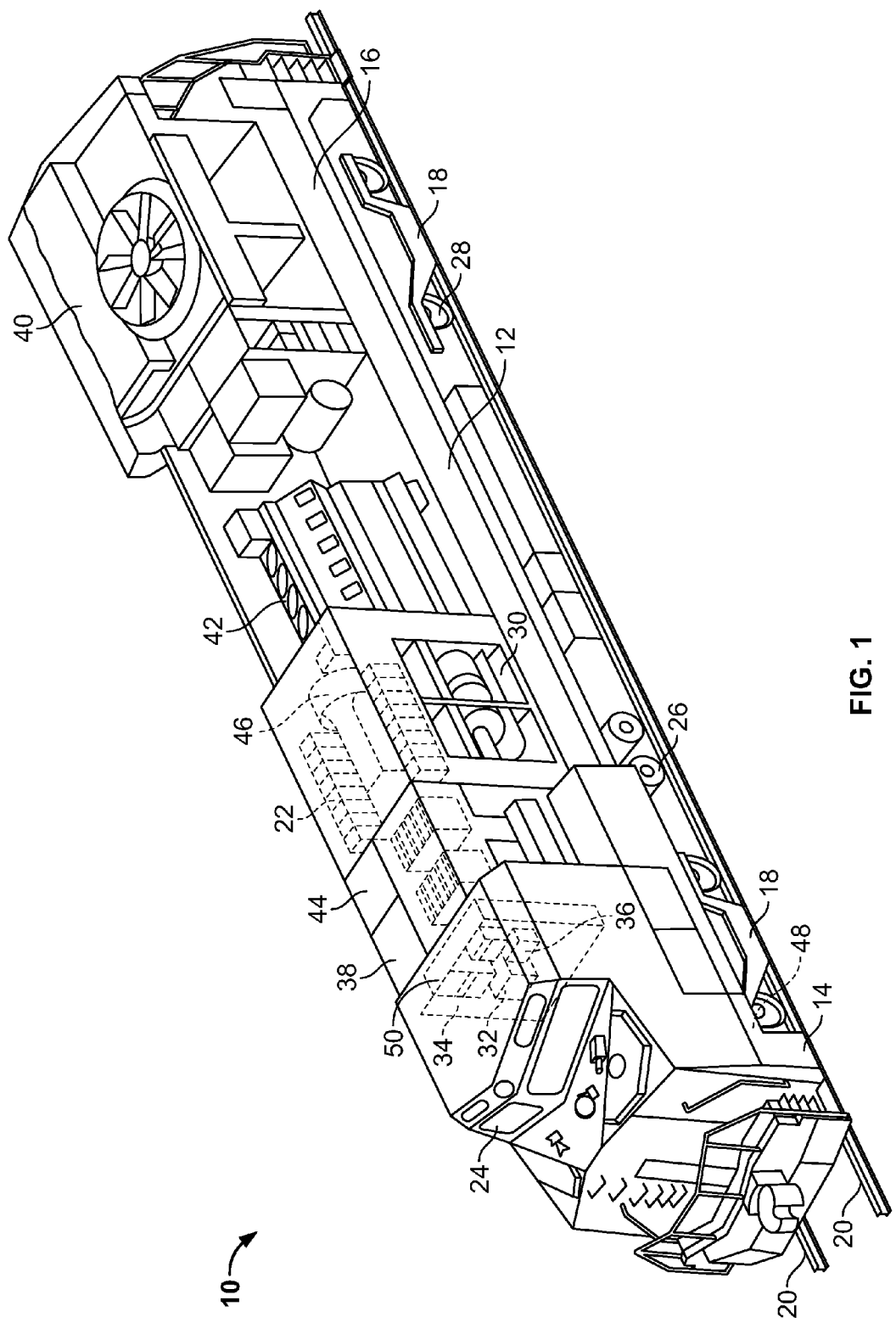
FIG. 1 is a perspective view of an exemplary locomotive.

FIG. 1 is a partial cut away view of an exemplary Off-Highway Vehicle (OHV). In the exemplary embodiment, the OHV is a locomotive 10. Locomotive 10 includes a platform 12 having a first end 14 and a second end 16. A propulsion system 18, or truck is coupled to platform 12 for supporting, and propelling platform 12 on a pair of rails 20. An equipment compartment 22 and an operator cab 24 are coupled to platform 12. An air and air brake system 26 provides compressed air to locomotive 10, which uses the compressed air to actuate a plurality of air brakes 28 on locomotive 10 and railcars (not shown) behind it. An auxiliary alternator system 30 supplies power to all auxiliary equipment and is also utilized to recharge a plurality of battery blocks that will be discussed below. An intra-consist communications system 32 collects, distributes, and displays consist data across all locomotives in a consist.

A cab signal system 34 links the wayside (not shown) to a train control system 36. In particular, system 34 receives coded signals from a pair of rails 20 through track receivers (not shown) located on the front and rear of the locomotive. The information received is used to inform the locomotive operator of the speed limit and operating mode. A distributed power control system 38 enables remote control capability of multiple locomotive consists coupled in the train. System 38 also provides for control of tractive power in motoring and braking, as well as air brake control.

An engine cooling system 40 enables engine 42 and other components to reject heat to cooling water. In addition, system 40 facilitates minimizing engine thermal cycling by maintaining an optimal engine temperature throughout the load range, and facilitates preventing overheating in tunnels. An equipment ventilation system 44 provides cooling to locomotive 10 equipment.

A traction alternator system 46 converts mechanical power to electrical power which is then provided to propulsion system 18. Propulsion system 18 enables locomotive 10 to move and includes at least one traction motor 48 and dynamic braking capability. In particular, propulsion system 18 receives power from traction alternator 46, and through traction motors 48 moves locomotive 10. Locomotive 10 systems are monitored and/or controlled by an energy management system 50.

Energy management system 50 generally includes at least one computer that is programmed to perform the functions described herein. Computer, as used herein, is not limited to just those integrated circuits referred to in the art as a computer, but broadly refers to a processor, a microprocessor, a microcontroller, a programmable logic controller, an application specific integrated circuit, and another programmable circuit, and these terms are used interchangeably herein.

Figure 2:
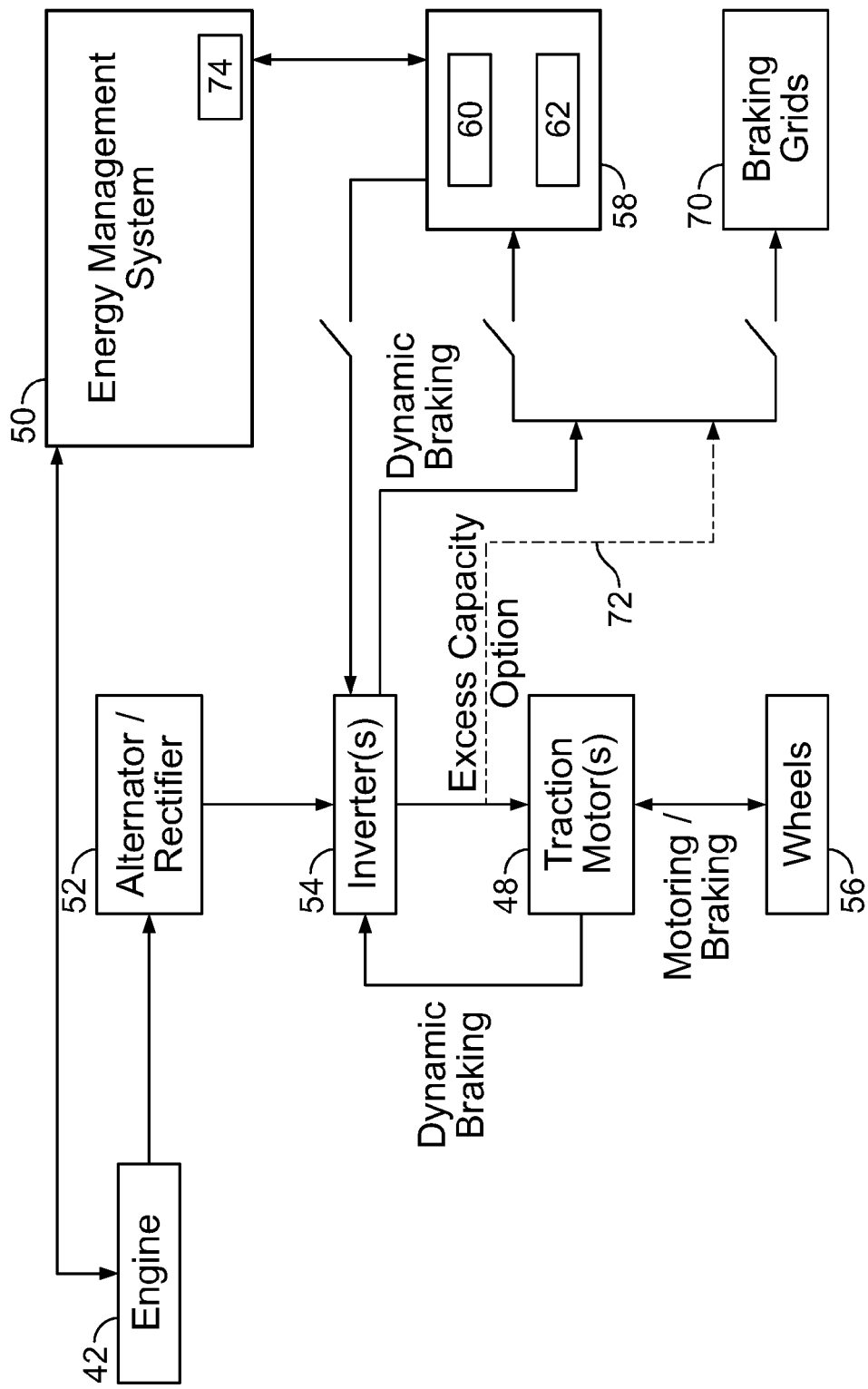
FIG. 2 is a simplified block diagram of a portion of the locomotive shown in FIG. 1.

FIG. 2 is a simplified block diagram of a portion of locomotive 10 shown in FIG. 1. As illustrated in FIG. 2, locomotive 10 includes a diesel engine 42 driving an alternator/rectifier 52. As is generally understood in the art, the alternator/rectifier 52 provides DC electric power to an inverter 54 which converts the DC electric power to AC to form suitable for use by traction motors 48. An inverter 54 converts DC power to AC power. A rectifier converts AC power to DC power. The term converter is also sometimes used to refer to inverters and rectifiers. The electrical power supplied in this manner may be referred to as prime mover power, or primary electric power, and the alternator/rectifier 52 may be referred to as a source of prime mover power. In a typical AC diesel-electric locomotive application, the AC electric power from the alternator is first rectified, i.e. converted to DC. The rectified AC is thereafter inverted, e.g., using power electronics such as Insulated Gate Bipolar Transistors (IGBTs) or thyristors operating as pulse width modulators, to provide a suitable form of AC power for the respective traction motors 48.

As discussed above, there is preferably a plurality of traction motors 48, e.g., one per axle, and each axle is coupled to a plurality of locomotive wheels 56. In other words, each locomotive traction motor 48 preferably includes a rotatable shaft coupled to the associated axle for providing tractive power to the wheels 56. Thus, each locomotive traction motor 48 provides the necessary motoring force to an associated plurality of locomotive wheels 56 to cause locomotive 10 to move.

During operation, the traction motors 48 also provide a braking force for controlling speed or for slowing locomotive 10. This is commonly referred to as dynamic braking, and is generally understood in the art. More specifically, when a traction motor 48 is not needed to provide motivating force, it can be reconfigured, via power switching devices, such that the traction motor 48 operates as a generator. So configured, the traction motor 48 generates electric energy which has the effect of slowing the locomotive 10. The energy generated in the dynamic braking mode is then transferred to at least one or plural resistive grids 70 that are mounted on the locomotive 10. Thus, the dynamic braking energy is converted to heat and dissipated from the system.

In the exemplary embodiment, the resistive grids 70 may be implemented utilizing a load bank that is configured to convert the electrical power discharged from a first battery block 80 and a second battery block 82 to heat and to dissipate the resultant power output of the battery blocks 60 and 62.

In the exemplary embodiment, energy capture and storage system 58 is implemented using the first battery 60 and the second battery block 62. Optionally, energy capture and storage system 58 includes only one or may include more than two individual battery blocks as well as associated external cabling and any associated internal cabling between multiple the individual battery blocks. Each of battery blocks 60 and 62 may be implemented using a lead acid battery or a nickel cadmium battery, for example.

As discussed above, locomotive 10 further includes at least two battery blocks that may be utilized to start diesel engine 42. In the exemplary embodiment, locomotive 10 includes at least a first battery block 80 and a second battery block 82. Moreover, each battery block 80 and 82 generally includes a plurality of cells. In the exemplary embodiment, each battery block 80 and 82 includes sixteen cells, wherein each cell is capable of providing approximately two volts, i.e. each block 80 and 82 has a voltage rating of approximately thirty-two volts. During operation, charged stored within battery blocks 80 and 82 is utilized to start diesel engine 42 via auxiliary starter/alternator system 30. Moreover, when diesel engine 42 is running, engine 42 drives starter/alternator system 30 to maintain a charge on battery blocks 80 and 82.

To monitor the health of the battery blocks, such as battery blocks 80 and 82 for example, the battery blocks are periodically tested using a known method which includes measuring the specific gravity of each cell in each battery block using a hydrometer. However, as discussed above the known method of testing battery blocks is very expensive and results in battery blocks being removed from locomotive 10 that were later shown to be acceptable or "good" during testing done at an external facility.

Figure 3:
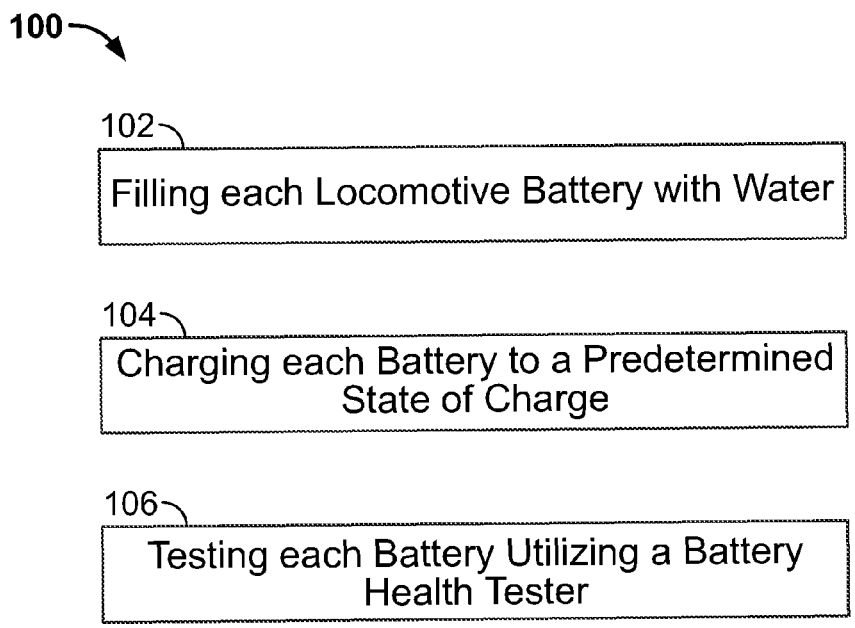
FIG. 3 is a flow chart illustrating an exemplary method for determining the health of a locomotive battery.

FIG. 3 is a flow chart illustrating an exemplary method 100 of determining the health of a locomotive battery block, such as battery blocks 80 and 82. Method 100 includes filling 102 each battery block 80 and 82 with water. More specifically filling 102 includes filling each battery block using distilled water. In the exemplary embodiment, the battery blocks may be filled utilizing a water gun, for example. The battery blocks 80 and 82 are filled such that each cell in each respective battery block contains approximately an equal amount of distilled water. In the exemplary embodiment, the water filling process is achieved automatically. That is, the water gun may include a sensor for example that is utilized to determine the level of water in each cell, in each respective battery block, and then transmit a signal that indicates when each cell is full. The signal automatically stops the water gun from channeling water to each respective battery block 80 and 82.

Method 100 further includes charging 104 each battery block 80 and 82 to a predetermined state of charge. In the exemplary embodiment, locomotive 10 may include a charging apparatus 74 (shown in FIG. 1) that in the exemplary embodiment is controlled by energy management system 50. Accordingly, the battery blocks are charged to bring their state of charge (SOC) to approximately the same level. Method 100 further includes testing 106 each battery block 80 and 82 utilizing a battery health tester.

Figure 4:
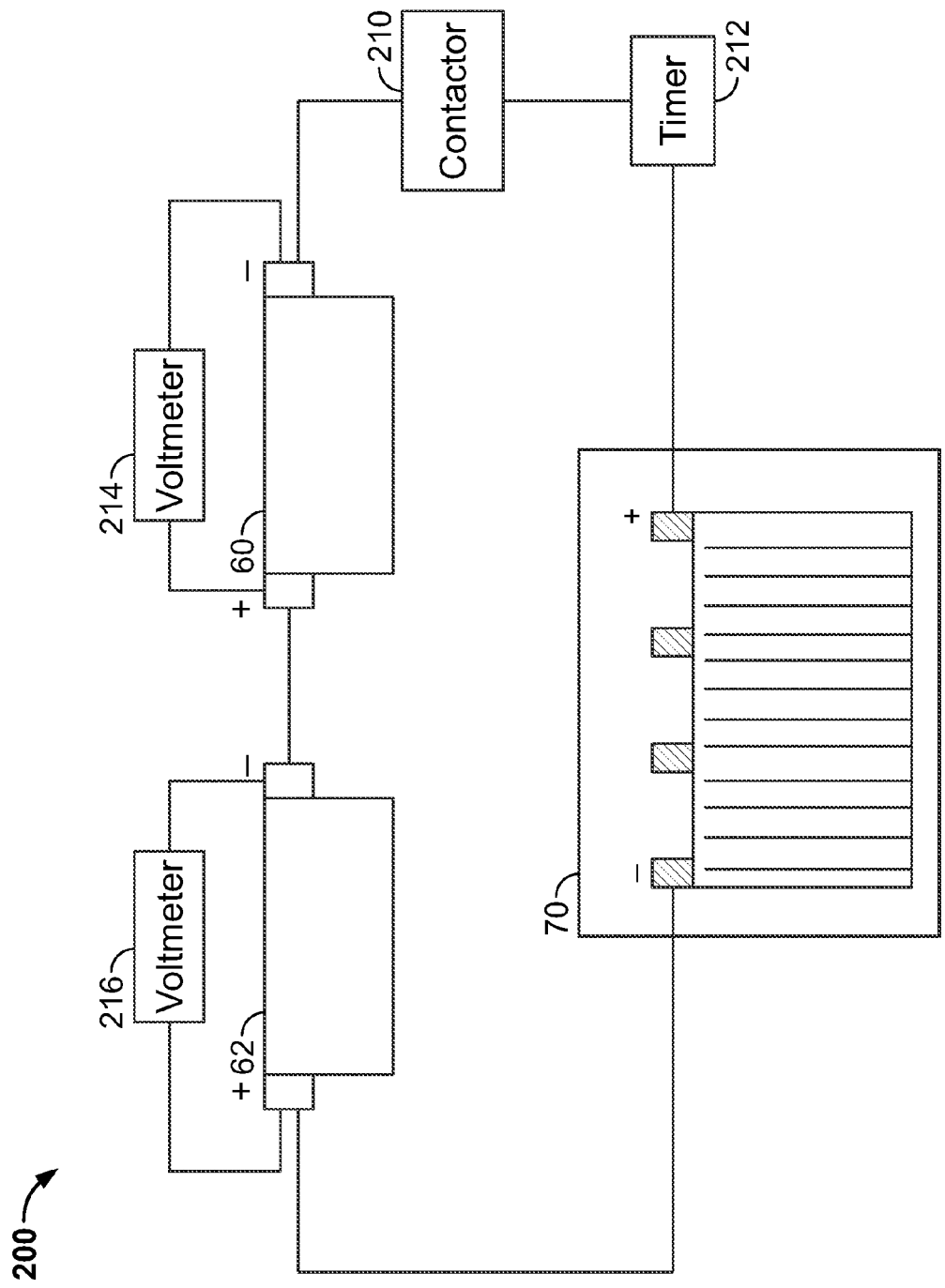
FIG. 4 is a simplified block diagram of an exemplary battery health tester that may be utilized with the method shown in FIG. 3.

FIG. 4 is a simplified block diagram of an exemplary battery health tester 200 that may be utilized with the method 100 shown in FIG. 3. In the exemplary embodiment, each component described in battery health tester 200 is installed on a mobile cart to enable a locomotive service operator to determine the health of the locomotive battery blocks 80 and 82 whenever desired. This battery health tester can be called as external or off-board battery health tester. In the exemplary embodiment, battery health tester 200 includes the resistive grid 70 that is coupled in series between battery blocks 80 and 82. Battery health tester 200 further includes a switch 210 and a timer 212. Switch 210 may be implemented using a contactor or an IGBT, for example. As shown in FIG. 4 switch 210 and timer 212 are coupled in electrical series between first battery block 80 and second battery block 82 and resistive grid 70. Battery health tester 200 also includes a first voltmeter 214 that is coupled in parallel with first battery block 80 and a second voltmeter 216 that is coupled in parallel with second battery 82.

In one embodiment, timer 212 may be implemented using a mechanical timer. Optionally, timer 212 may be implemented using software installed in the energy management system 50, for example. Moreover, voltmeters 214 and 216 may be implemented with local gauges or may be implemented by installing sensors that are configured to transmit a signal to energy management system 50, to enable an operator to determine the voltage of each respective battery block 80 and 62 at a remote location.

Figure 5:
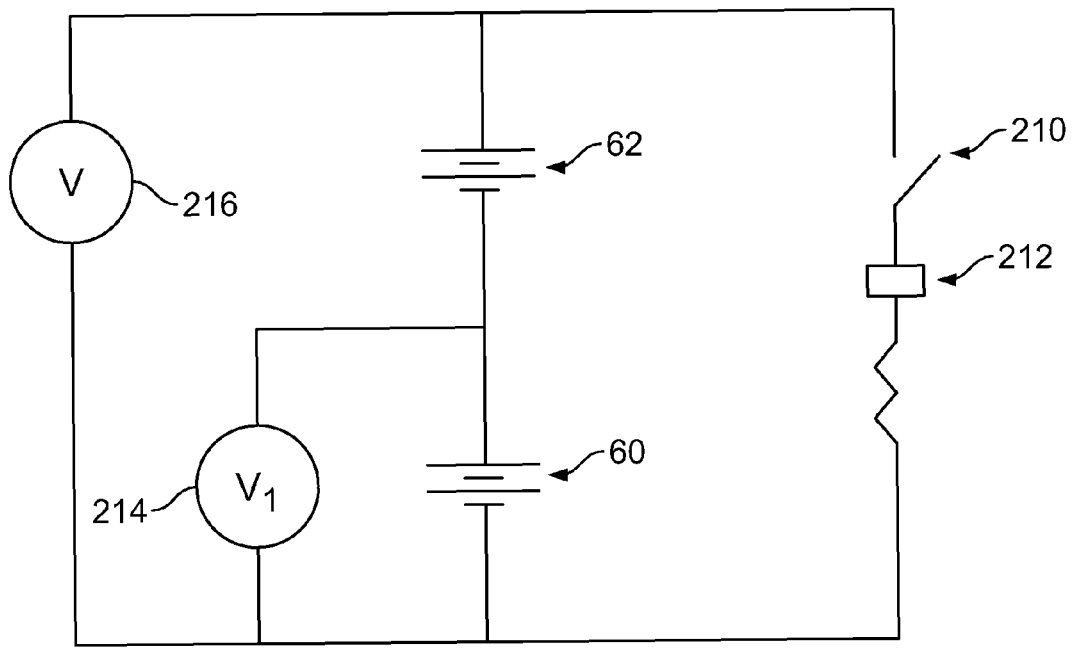
FIG. 5 is a simplified circuit diagram of the on-board battery health tester that can be installed on the locomotive.

FIG. 5 is a simplified circuit diagram of battery on-board health tester 200 on a locomotive that will be utilized to discuss the operation of battery health tester 200 by a locomotive operator. A contactor, a grid, and a voltmeter may already be a part of the locomotive equipment. An additional voltmeter is installed inside the operator cab and the grid, voltmeter and contactor is wired as shown in FIG. 5 to form can be made into a on-board battery health tester. During operation when an operator desires to determine the health of either battery 80 or battery 82, the operator activates switch 210 through a push button or any other type of switch to close the circuit. Switch 210 may be any type of switch that is configured to enable the transmission of electrical energy between battery blocks 80 and 82 and resistive grid 70. Moreover, switch 210 may be located in the cab area or may optionally be located proximate to battery blocks 80 and 82. In operation, activating switch 210 causes an electrical signal to be transmitted to timer delay circuit (not shown) that is associated with switch 210. More specifically, since the test utilizes a relatively large current, the switch enables the operator to initiate the testing sequence and the delay circuit allows the operator sufficient time to clear the testing area prior to the switch closing to initiate the test.

Once the switch 210 closes, an electrical signal is transmitted through timer 212, thus activating timer 212, and approximately simultaneously allow the flow of current between battery blocks 80 and 82 and resistive grid thus commencing the health testing of the battery blocks. More specifically, the timer 212 is utilized to control the length of the battery health testing process. In one embodiment, timer 212 may be set by the operator. Optionally, the timer 212 is set at the factory using a priori knowledge of the battery blocks and locomotive. In the exemplary embodiment, timer 212 is set such that the length of the battery testing process is between approximately five seconds and approximately 30 seconds.

During the testing process, i.e. switch 210 is in a closed position, approximately 900 to approximately 1100 amps are drawn from battery blocks 60 and 62 utilizing resistive grid 70. The voltage across battery block 80 (V1) is then determined using voltmeter 214, moreover the voltage across both battery blocks (V) is determined using voltmeter 216. The health of battery blocks 80 and 82 can then be determined in accordance with V2=V−V1. A current of approximately 1000A for two seconds is generally expected to crank the engine. In the exemplary embodiment, a voltage of approximately 24 Volts per monoblock is determined to be a threshold indicating the health of the battery. The 24 Volt threshold is determined using:

$VA1 - VB1 = IR$, where

VA1 represents the open circuit voltage of battery #1,
VB1 represents the voltage of battery #1 under load,
R represents the resistance, and
I represents the current.

If the battery cannot produce approximately 1000 A current initially for about two seconds to rotate the engine, it is considered to be a problem in the battery. Given that in the exemplary embodiment, the resistance of single monoblock is about 7 milli-Ohms when fully charged the battery voltage needed to crank the engine may be determined.

For example, the voltage of a fully charged monoblock is approximately 33.5 Volts-34.0 Volts. Under a 1000 Amp load, the voltage will drop to approximately 26.0 Volts. Using V/R=I, it can be determined that (34−26)/0.007=1142 Amps. A current of 1142 Amps will rotate the engine and crank.

However, if the loaded voltage drops to approximately 24.0 Volts, the greater voltage drop being due to increased resistance of the monoblock from 7 milli-Ohms to approximately 12 milli-Ohms. V/R=I, yields (34−24)/0.012=833 Amps. Because the resistance of the monoblock has increased due to some defect, only 830 Amps of current can be generated, which will not rotate the engine. These were determined by experimental results. Alternatively, the maximum resistance which will permit the fully charged monoblock to crank the engine is approximately (34−24)/1000=0.01 Ohm. If the resistance of the monoblock increases above this value, the monoblock may considered to be a bad battery. The calculation of current based on higher resistance (e.g. 0.012 ohms) and drop of voltage to 24 Volts will result in a current of about 833 Amps, (34−24/0.012=833 Amps) which is not enough to rotate the engine. A difference of 2.0 Volts or more between two 16-cell monoblock also is considered bad due to inequality in voltage of each monoblock. Both monoblocks are connected in series and are charged and discharged at the same time with same current and voltage on locomotive and their health and voltage drop should be same under the load. If one drops down in voltage more than other, it indicates that one or two cells in one monoblock are bad. This difference is about 2-volt. The resistance of 12 milli-Ohms is derived from data collected on several good and bad batteries.

More specifically, the voltage of the battery blocks (V1 and V2) is related to VA1−VB1=IR, wherein VA1≈open circuit voltage of battery block 80, VB1≈voltage under load of battery block 80, R=Resistance, and I=current.

Moreover, the combined resistance of both battery blocks is approximately seven milliohms. During operation, approximately 1000 amps are applied to the battery blocks 80 and 82 for approximately fifteen seconds to rotate the engine. However, if battery blocks 80 and 82 are not capable of outputting the approximately 1000 amps, this may be indicative of a failure of either one or both of battery blocks 80 and 82. After the timer 212 has expired, switch 210 is commanded open thus completing the testing process.

For example, typically, each fully charged battery block 80 and 82 maintains approximately 33.5-34 volts and when subjected to a 1000 amp load, drops to approximately 26 volts, e.g. 34−26/0.007=1142, resulting in a current output of approximately 1142 amps, which is still sufficient to start the diesel engine.

However, assuming the voltage of either battery block 80 and 82 drops to 24 volts, the increased voltage drop caused by an increased resistance in the battery block, results in a current output of approximately 666 amps, e.g. 34−24/0.015=666.

As a result, the increased resistance, which may be caused by a defect in one or both battery blocks, is generally insufficient to start the diesel engine. It should be realized that the above referenced voltage and current values are exemplary only, and may vary depending on the size of type of battery blocks installed in the locomotive.

Optionally, the above values may be calculated by subtracting the battery block voltage under load from the fully charged battery block voltage and dividing the resultant voltage by the supplied current, e.g. 34−24/1000=0.01 Ohm.

Assuming that the maximum resistance that is required to start the diesel engine is 0.01 ohms, any value greater than 0.01 ohms indicates that the battery block is "bad" and should be replaced. Moreover, a difference of two or more volts between the battery blocks may be indicative that one of the battery blocks 80 or 82 should be replaced. For example, since the battery blocks 80 and 82 are connected in series and act as "sisters," they are charged and discharged at the same time and the same current level. As such, if the voltage drop of one of the battery blocks is greater than the voltage drop of the other battery block, e.g. two or more volts, this provides an indication that one or more cells in the battery block is not functioning as desired or is "bad."

Described above is an onboard battery health tester that utilizes components installed on locomotive 10 to perform a health test on the locomotive battery blocks. As discussed above, the battery health tester 200 includes resistive grid 70. In one mode of operation, resistive grid 70 is utilized to convert dynamic braking energy to heat energy and dissipate the heat energy from the system.

In another mode of operation, resistive grid 70 is utilized by battery health tester 200 to determine the health of battery blocks 80 and 82. Battery health tester 200 also includes a delay circuit that functions as a safety device to enable personnel to exit the testing area, and also includes a testing timer circuit that is utilized to set such the length of the battery block testing process.

Figure 6:
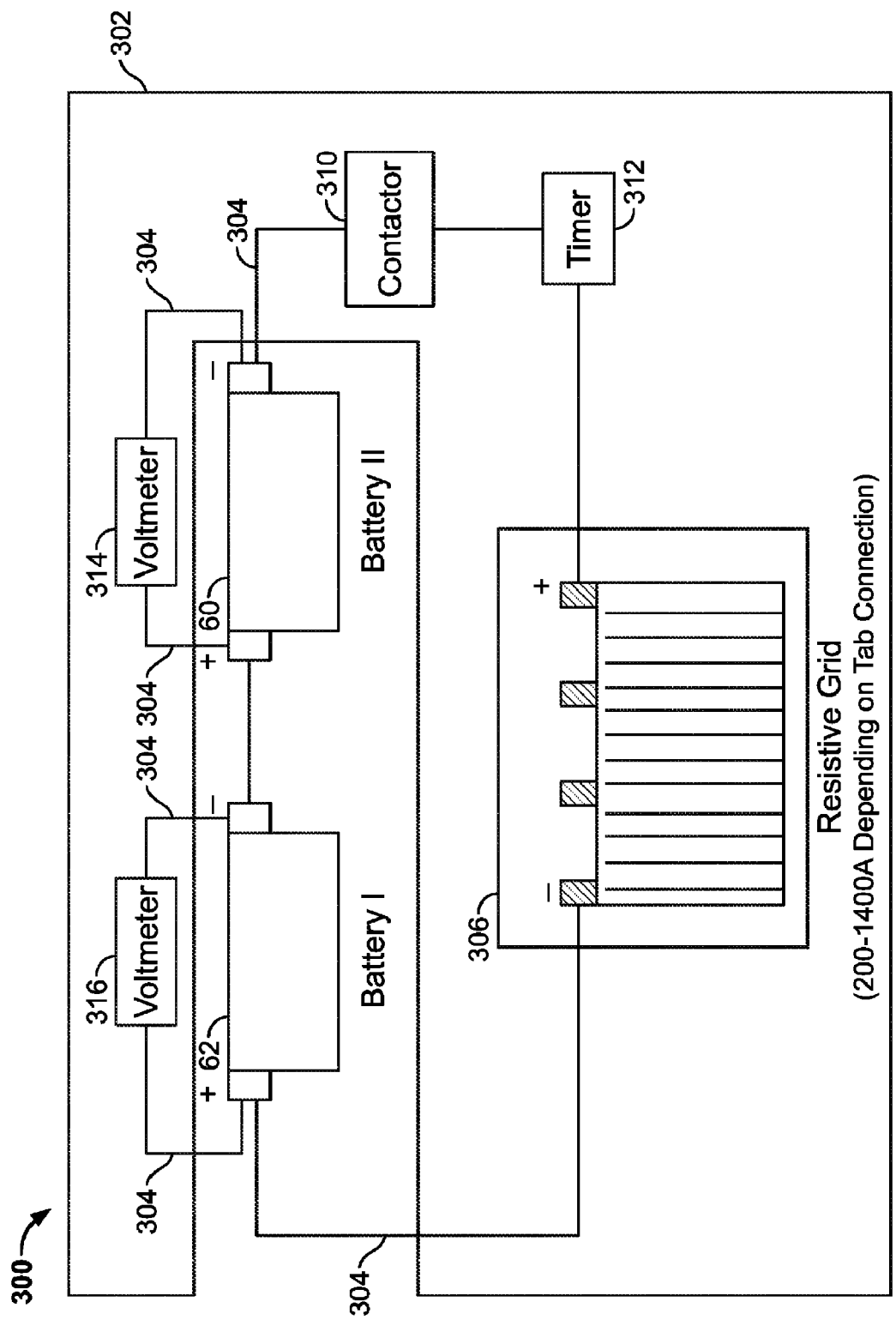
FIG. 6 is another exemplary battery health tester that may be utilized on-board or off-board with an OHV such as the locomotive shown in FIG. 1.

FIG. 6 is another exemplary battery health tester 300 that may be utilized on-board or off-board with an OHV such as locomotive 10 shown in FIG. 1. In this embodiment, battery health tester 300 is installed on a portable skid 302 that may be transported to locomotive 10 to enable an operator to determine the health of the locomotive battery blocks whenever desired. Skid as used herein is defined as a modular platform or baseplate that includes wheels to enable the battery health tester to be transported to various locations to perform battery health testing.

In this exemplary embodiment, battery health tester 300 includes a resistive grid 306 and various wires and connectors 304 (not shown) to enable the resistive grid 306 to be coupled in series between first battery block 80 and second battery block 82. Battery health tester 300 further includes a switch 310 and a timer 312. As shown in FIG. 6 switch 310 and timer 312 are coupled in electrical series between first battery block 80 and resistive grid 306. Battery health tester 300 also includes a first voltmeter 314 that is coupled in parallel with first battery block 80 and a second voltmeter 316 that is coupled in parallel with second battery block 82.

In one embodiment, timer 312 may be implemented using a mechanical timer. Optionally, timer 312 may be implemented using software installed in a computer (not shown) that is coupled to skid 302. Moreover, voltmeters 314 and 316 may be implemented with local gauges or may be implemented by sensors that are configured to transmit a signal to the skid computer to enable an operator to determine the voltage of each respective battery block 80 and 62.

During operation when an operator desires to determine the health of either battery block 80 or battery block 82, the operator activates switch 310. Switch 310 may be any type of switch that is configured to enable the transmission of electrical energy between resistive grid 306 and battery blocks 60. In operation, activating switch 310 causes an electrical signal to be transmitted to the timer delay circuit (not shown) that is associated with switch 310. More specifically, since the test utilizes a relatively large current, the switch enables the operator to initiate the testing sequence and the timer delay circuit allows the operator sufficient time to clear the testing area prior to the switch 310 closing to initiate the test.

Once, the switch 310 closes, an electrical signal is transmitted through timer 312, thus activating timer 312, and approximately simultaneously allow the flow of current between battery blocks 60 and 62 and resistive grid thus commencing the health testing of the battery blocks 80 and 82. More specifically, the timer 312 is utilized to control the length of the battery health testing process. In one embodiment, timer 312 may be set by the operator. Optionally, the timer 312 is set at the factory using a priori knowledge of the battery blocks and locomotive. In the exemplary embodiment, timer 312 is set such that the length of the battery testing process is between approximately five seconds and approximately 30 seconds.

During the testing process, i.e. switch 310 is in a closed position, approximately 900 to approximately 1100 amps are applied to battery blocks 80 and 82 utilizing resistive grid 306. The voltage across battery block 80 (V1) is then determined using voltmeter 314, moreover the voltage across battery block 82 (V2) is determined using voltmeter 316. The health of battery blocks 80 and 82 can then be determined in accordance with V=V2−V1 as discussed above. After the timer 312 has expired, switch 310 is commanded open thus completing the testing process.

Described above is a portable battery health tester that is utilized to perform a health test on the locomotive battery blocks. As discussed above, the battery health tester 300 includes a portable resistive grid 306 similar to the resistive grid 70 installed on locomotive 10 to determine the health of battery blocks 60 and 62. Battery health tester 300 also includes a delay circuit that functions as a safety device to enable personnel to exit the testing area, and also includes a testing timer circuit that is utilized to set such the length of the battery testing process.

Figure 7:
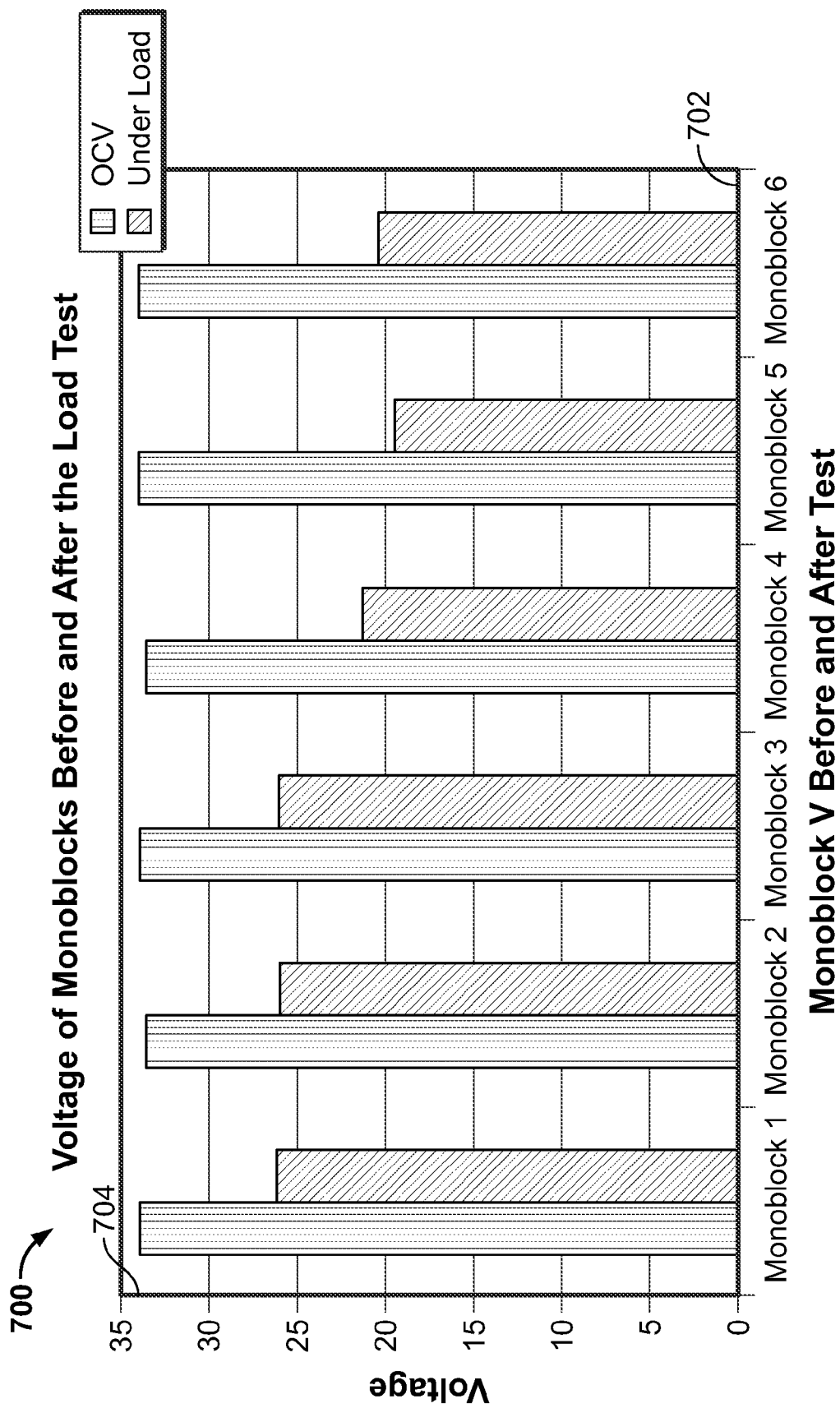
FIG. 7 is a bar chart illustrating test data obtained from a plurality of battery monoblocks utilizing a health tester.

FIG. 7 is a bar chart 700 illustrating test data obtained from a plurality of battery monoblocks utilizing either health tester 200 or health tester 300 described above. In the exemplary embodiment, bar chart 700 includes an x-axis 702 indicating the tested monoblock voltage before and after a test. Bar chart 700 includes a y-axis graduated in units of voltage. A pair of bars represents the voltage of a single monoblock before and after the load test. Each pair of bars shows a voltage of a respective monoblock before and after the test. It can be seen that both batteries in first test dropped to approximately 26.0 Volts. These were determined to be "good" batteries (monoblock 1 and 2). In the second test (monoblock 3 and 4) the initial open circuit voltage of monoblocks 3 and 4 were approximately 33V. Under the load of the tester, one monoblock (monoblock 3) dropped down to approximately 26V and other monoblock (monoblock 4) dropped down to approximately 21 V. The drop in voltage of monoblock 3 and 4 indicates that monoblock 3 is "good" but monoblock 4 is "bad." The third test for monoblocks 5 and 6 shows both monoblocks are "bad" as the voltage dropped down to approximately 20 Volts, which is below the selected threshold value of 24.0 Volts. It is important to note that resistance of batteries dropping below 24 Volts is so high that the battery is not capable of delivering 1000A current required to crank the engine. In first test, voltages of batteries 60 and 62 obtained under load are substantially higher than 24 V indicating that the health of both batteries is acceptable, i.e. both are "good" batteries. However, other data on monoblocks 3, 4, 5 and 6 indicate that the voltage drop is either greater than the selected threshold, in this case 24 Volts or the difference in the voltage drop between the two monoblocks in the same battery is greater than a predetermined threshold.

Figure 8:
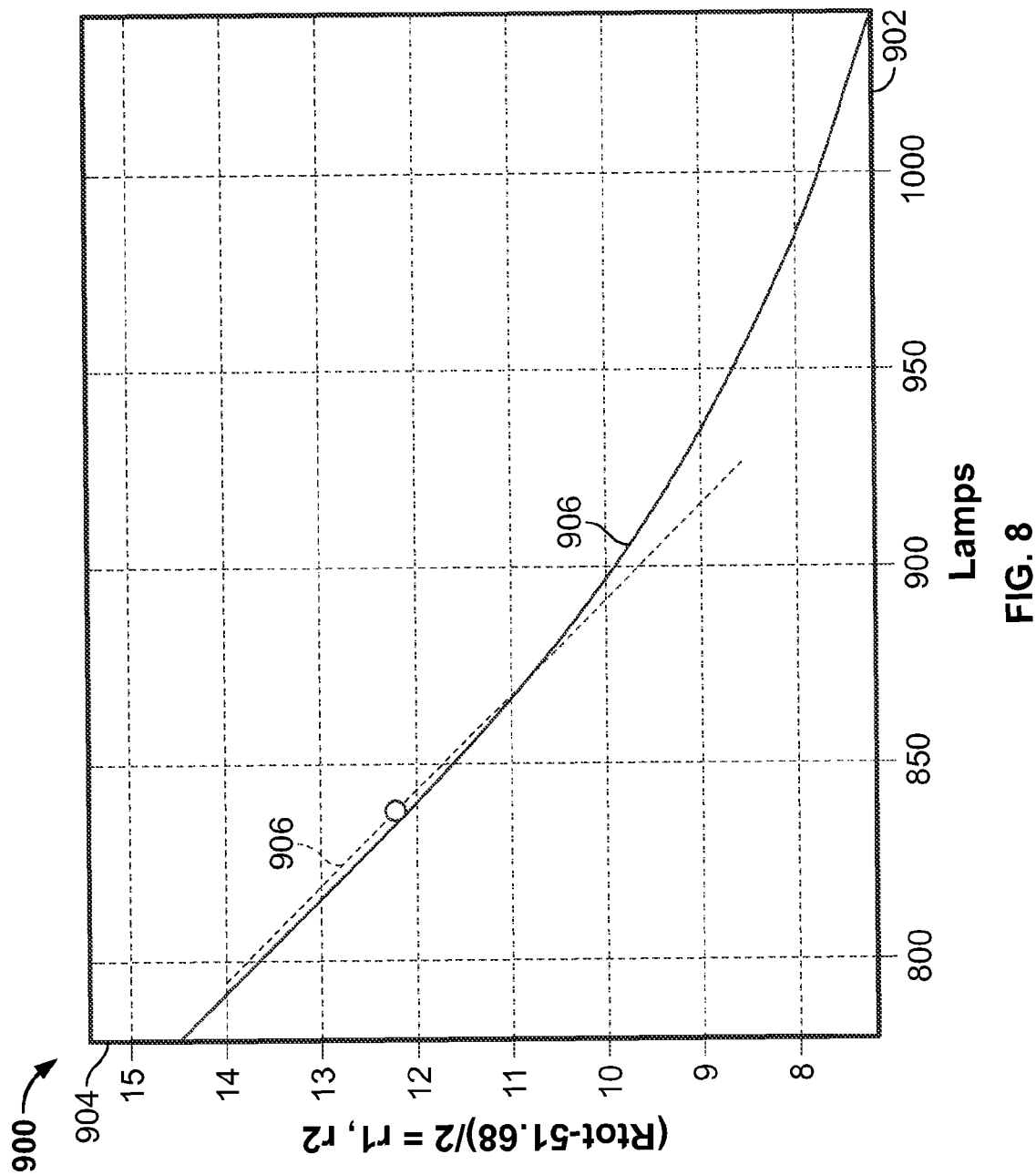
FIG. 8 is a graph of an exemplary performance curve for a battery in accordance with an embodiment of the present invention.

FIG. 8 is a graph 900 of an exemplary performance curve for a battery in accordance with an embodiment of the present invention. Graph 900 includes an x-axis 902 graduated in units of electrical current and a y-axis 904 graduated in units of milli-Ohms of resistance of the monoblock. Graph 900 illustrates a trace 906 illustrating an ideal curve of resistance versus load current for a monoblock and a trace 908 illustrating an actual curve of resistance versus load current for a monoblock under test. Trace 908 illustrates that a current of 833 Amps can be supplied by a battery at resistance of 0.012 Ohms and after this resistance the current drops quickly.

While the invention has been described in terms of various specific embodiments, those skilled in the art will recognize that the invention can be practiced with modification within the spirit and scope of the claims.

What is claimed is:

1. A method for testing the health of battery blocks, said method comprising:
    coupling a load to a first and a second battery block, the first and second battery blocks are coupled in series;
    activating a switch coupled between the first and second battery blocks and the load to channel electrical energy from the load to the first and second battery blocks;
    activating a delay circuit to facilitate delaying the closing of the switch;
    determining a voltage of the first and second battery blocks; and
    utilizing the determined voltage to determine the health of the first and second battery blocks.

2. A method in accordance with claim 1, wherein coupling a load to a first and a second battery block further comprises coupling a resistive grid to a first and a second locomotive battery block that are coupled in series.

3. A method in accordance with claim 1, further comprising:
    filling each battery block with water; and
    charging each battery block to bring their state of charge (SOC) to approximately the same level.

4. A method in accordance with claim 3, further comprising automatically filling each battery block with distilled water.

5. A method in accordance with claim 2, further comprising activating a timer that is disposed between the resistive grid and the switch, wherein the timer is configured to open the switch after a predetermined quantity of time.

6. A method in accordance with claim 5, further comprising activating a timer that is disposed between the resistive grid and the switch, wherein the timer is configured to open the switch between approximately five seconds and approximately 30 seconds after the switch has been closed.

7. A method in accordance with claim 1, wherein determining a voltage of the first and second battery blocks further comprises:
    determining a first voltage across the first battery block;
    determining a second voltage across the first and second battery blocks; and
    subtracting the first voltage from the second voltage to determine the health of the first and second battery blocks.

8. A battery block health tester comprising:
    a portable skid;
    a load mounted on said portable skid;
    a switch coupled between a pair of battery blocks and said load, said switch utilized to channel electrical energy from said load to said pair of battery blocks to facilitate testing the pair of battery blocks; and
    a timer coupled between said load and said switch, said timer configured to open said switch after a predetermined quantity of time.

9. A battery block health tester in accordance with claim 8, wherein said switch comprises a delay circuit configured to delay the closing of said switch when said switch is activated by an operator.

10. A battery block health tester in accordance with claim 8, wherein said timer configured to open said switch between approximately five seconds and approximately 30 seconds after said switch has been closed.

11. A battery block health tester in accordance with claim 8, wherein said pair of battery blocks comprise a first locomotive battery block and a second locomotive battery block coupled in series with the first locomotive battery block, said health tester further comprises:
    a first voltmeter coupled in parallel with the first locomotive battery block; and
    a second voltmeter coupled in parallel with the second locomotive battery block.

12. A battery block health tester in accordance with claim 11, further comprising a computer programmed to subtract the first voltage from the second voltage to determine the health of the first and second locomotive battery blocks.

13. A battery block health tester in accordance with claim 8, wherein said load comprises a resistive grid having a resistance that is between approximately 30 and approximately 40 ohms to enable between approximately 200 and approximately 1100 amps to be supplied to said pair of battery blocks.

14. A train locomotive comprising:
    a first battery block;
    a second battery block coupled in series with said first battery block;
    a resistive grid coupled to said first and second battery blocks; and
    a battery block health tester configured to utilize said resistive grid to determine the health of said first and second battery blocks wherein said resistive grid is configured to dissipate heat when said locomotive is operated in a dynamic braking mode and to channel electrical energy to said first and second battery blocks when testing the health of said first and second battery blocks.

15. A train locomotive in accordance with claim 14, further comprising a delay circuit configured to delay the closing of said switch when said switch is activated by an operator.

16. A train locomotive in accordance with claim 14, further comprising a timer coupled between said resistive grid and said switch, said timer configured to open said switch after a predetermined quantity of time.

17. A train locomotive in accordance with claim 16, wherein said timer configured to open said switch between approximately five seconds and approximately 30 seconds after said switch has been closed.

18. A train locomotive in accordance with claim 14, further comprising:
- a first voltmeter coupled in parallel with the first battery block; and
- a second voltmeter coupled in parallel with the second battery block; and
- a computer programmed to subtract a first voltage obtained from said first voltmeter from a second voltage obtained from said second voltage to determine the health of said first and second battery blocks.

* * * * *